United States Patent
Dietrich et al.

(10) Patent No.: US 11,996,903 B2
(45) Date of Patent: May 28, 2024

(54) DEVICE AND METHOD FOR ASSESSING A STATE OF A RADIO CHANNEL

(71) Applicant: Robert Bosch GmbH, Stuttgart (DE)

(72) Inventors: Steven Dietrich, Langenau (DE); Christoph Zimmer, Korntal (DE); Henrik Klessig, Renningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 346 days.

(21) Appl. No.: 17/447,687

(22) Filed: Sep. 14, 2021

(65) Prior Publication Data

US 2022/0103272 A1    Mar. 31, 2022

(30) Foreign Application Priority Data

Sep. 29, 2020   (DE) ............... 10 2020 212 301.2

(51) Int. Cl.
*H04B 17/391*    (2015.01)
*G06F 30/27*    (2020.01)
*H04W 72/044*    (2023.01)

(52) U.S. Cl.
CPC ......... *H04B 17/3912* (2015.01); *G06F 30/27* (2020.01); *H04W 72/046* (2013.01)

(58) Field of Classification Search
CPC ... H04B 17/3912; G06F 30/27; H04W 72/046
See application file for complete search history.

(56) References Cited

FOREIGN PATENT DOCUMENTS

WO    2020234902 A1    11/2020

*Primary Examiner* — Natasha W Cosme
(74) *Attorney, Agent, or Firm* — NORTON ROSE FULBRIGHT US LLP; Gerard A. Messina

(57) ABSTRACT

A method for assessing a state of a radio channel. The method includes: ascertaining or providing a piece of state information, which characterizes a simulated state of a spatial arrangement of components of the surroundings of the wireless communication network; ascertaining at least one prediction based on a machine-trained model, the state information being provided as an input parameter in an input section of a machine-trained model, the state information being propagated by the machine-trained model, and the at least one prediction of a piece of channel state information based on the machine-trained model, which characterizes a state of at least one radio channel between two communication modules, being provided in an output section of the machine-trained model.

12 Claims, 6 Drawing Sheets

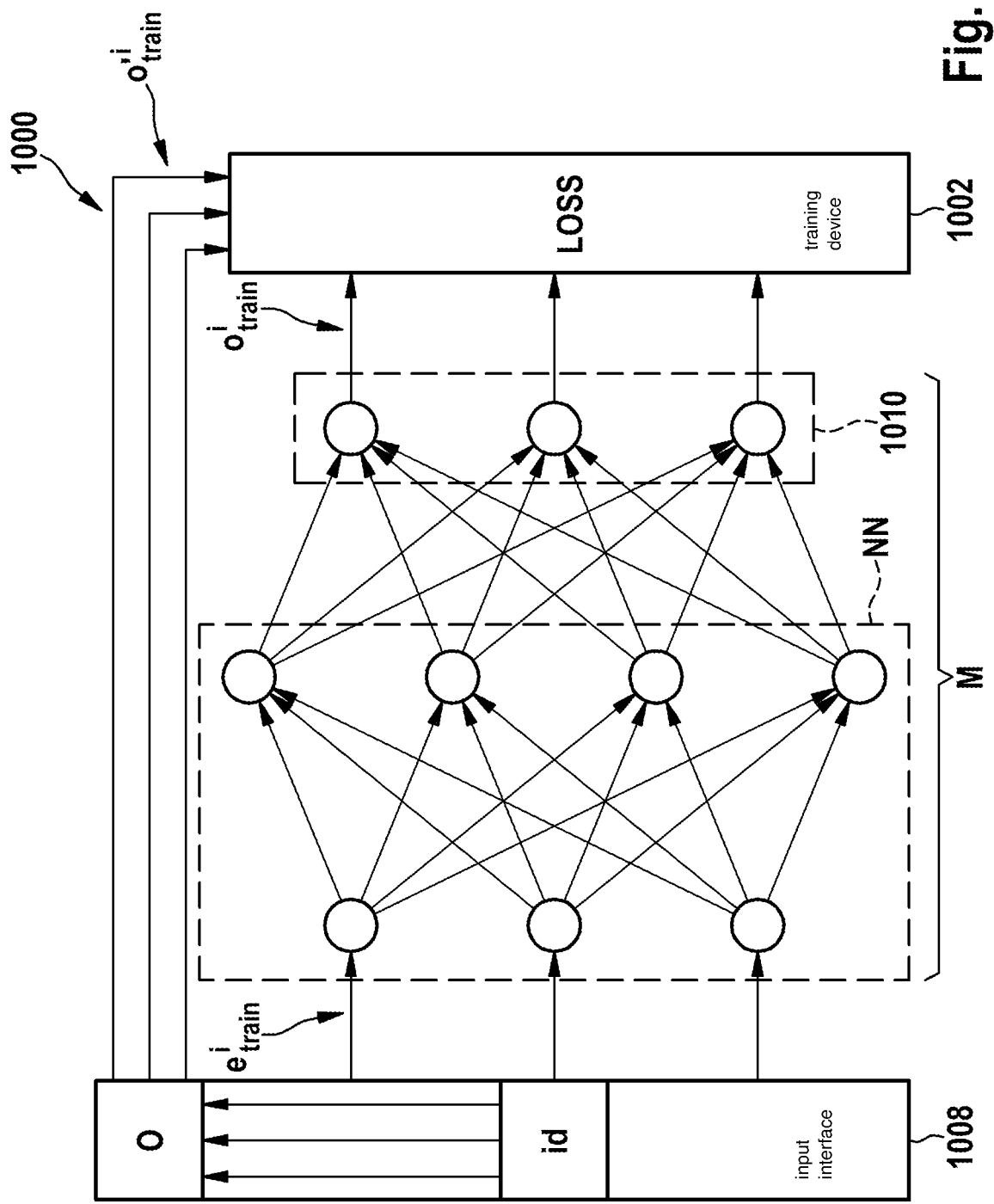

DEVICE AND METHOD FOR ASSESSING A STATE OF A RADIO CHANNEL

FIELD

Figure 1:
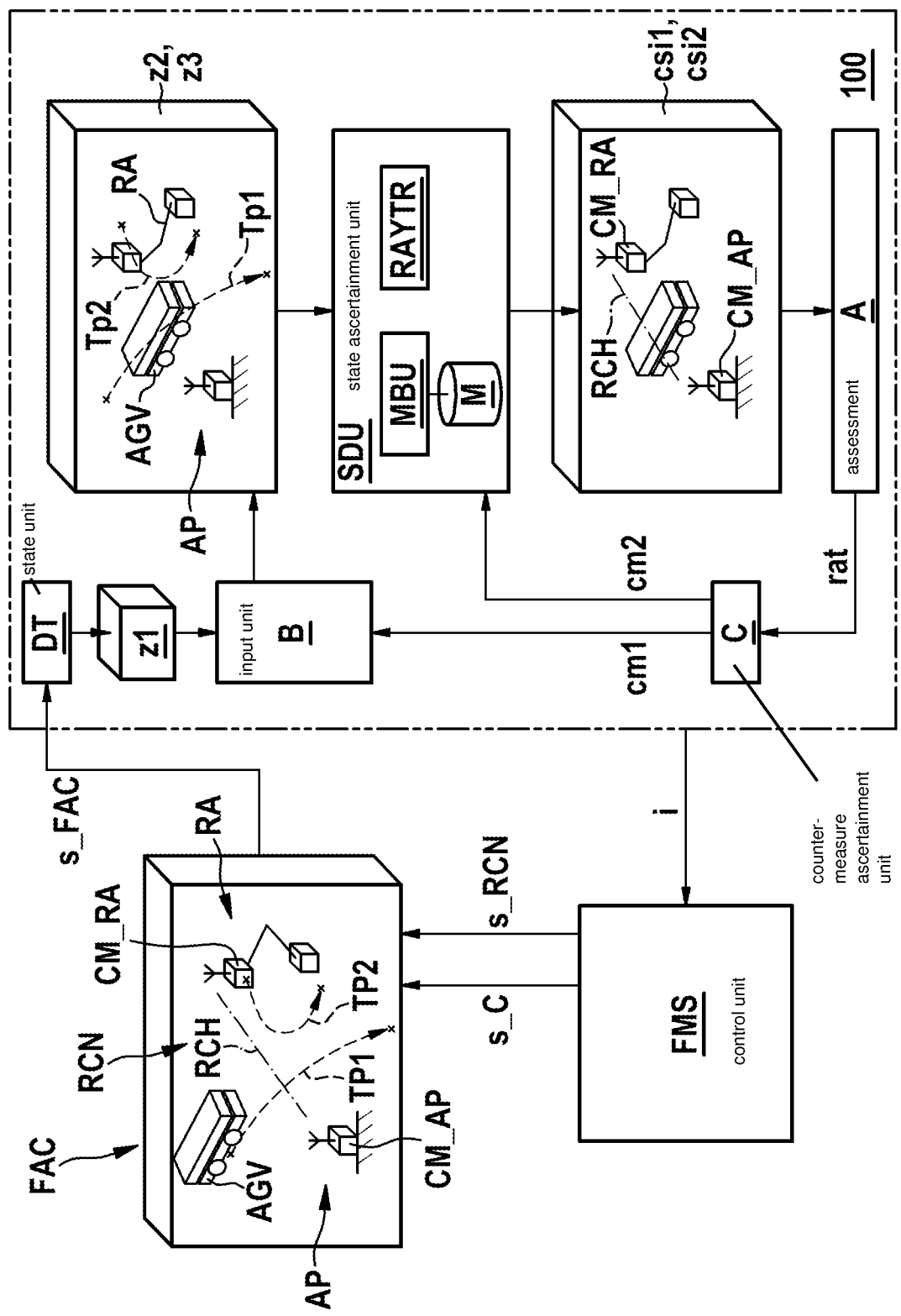

The present invention relates to improvements in the area of assessing a state of a radio channel.

SUMMARY

The problem underlying the present invention is addressed by a device in accordance with an example embodiment of the present invention, by a method according to another example embodiment of the present invention, and by a device and a method for training a model, in accordance with example embodiments of the present invention.

One aspect of the present relates to a device. In accordance with an example embodiment of the present invention, the device includes: an input unit, which is configured in such a way that a piece of state information, which characterizes a simulated state of a spatial arrangement of components of the surroundings of the wireless communication network, is ascertained or provided; a model-based ascertainment unit, which is configured in such a way that the state information is provided as an input parameter in an input section of a machine-trained model, that the state information is propagated by the machine-trained model, and that at least one prediction of a piece of channel state information, which characterizes a state of at least one radio channel between two communication modules, is provided in an output section of the machine-trained model.

This results in the possibility of accelerating the ascertainment of the prediction, since the model-based ascertainment unit completes the ascertainment in a shorter period of time with a comparable quality of result than a raytracer, which simulates the channel propagation based on the state information.

In one advantageous example embodiment of the present invention, the device includes: the input unit, which is configured in such a way that a plurality of pieces of state information are ascertained as a function of a plurality of positions of a plurality of candidate trajectories of at least one component of the surroundings; and the model-based ascertainment unit, which is configured in such a way that a respective prediction based on the machine-trained model is ascertained for each of the plurality of pieces of state information; a path selection unit, which is configured in such a way that one of the candidate trajectories is selected as a function of the plurality of the predictions assigned to one of the respective candidate trajectories.

The path selection unit together with the model-based ascertainment units advantageously creates a possibility of assessing potential candidate trajectories and of providing a recommendation in terms of the selection, so that the radio communication may be maintained.

In one advantageous example embodiment of the present invention, the device includes: a raytracer, which is configured in such a way that at least one prediction of the at least one piece of channel state information based on the raytracer is ascertained as a function of the ascertained state information; and a coordination unit, which is configured in such a way that the operation of the model-based ascertainment unit and of the raytracer is coordinated.

The raytracing is advantageously accelerated with the aid of the raytracer by using the machine-trained model. The radio wave propagation may thus be efficiently predicted for future situations. The combination of a raytracer, of the digital representation of the surroundings and of a model based on machine learning allows the model to learn characteristics about the radio wave propagation, in order to support the raytracing method. A rapid prediction of the characteristics of radio channels, which make the decision making in the manufacturing system possible, is provided.

In one advantageous example embodiment of the present invention, the coordination unit includes: a pre-processing unit, which is configured in such a way that the state information that characterizes the state of the surroundings of the wireless communication network is compared with a further piece of state information that characterizes a further state of the surroundings of the wireless communication network, and that as a function of the comparison, either the model-based ascertainment unit or the raytracer is activated for ascertaining the respective prediction.

It may be advantageously established before the activation of the model-based ascertainment unit or of the raytracer whether the accuracy of the result of the model-based ascertainment unit is sufficient. The average processing time may be correspondingly reduced, since unnecessary multiple calculations are omitted.

In one advantageous example embodiment of the present invention, the further piece of state information represents at least a portion of the training input data with which the machine-trained model has been trained.

If, therefore, the pieces of state information exhibit characteristics that match, or are similar to, the further pieces of state information, this indicates the use of the model for ascertaining the prediction.

In one advantageous example embodiment of the present invention, the device includes: the model-based ascertainment unit, which is configured in such a way that a confidence level for the at least one prediction based on the machine-trained model is ascertained with the aid of the machine-trained model; and a post-processing unit of the coordination unit, the post-processing unit being configured in such a way that the raytracer is activated for ascertaining the prediction based on the raytracer as a function of the ascertained confidence level or the prediction is provided based on the machine-trained model.

If the trained model is not accurate enough for the provided or ascertained state information, this is then indicated by the reliability. Accordingly, the coordination unit effectuates an activation of the raytracer in order to ascertain a more precise prediction.

In one advantageous example embodiment of the present invention, the device includes: the input unit, which is configured in such a way that in addition to the state information, a plurality of radio lobe coordinates, which are associated with at least one communication module of the wireless communication network, are ascertained or provided; the model-based ascertainment unit, which is configured in such a way that the state information and the radio lobe coordinates are provided as input parameters in an input section of the machine-trained model, that the state information and at least one of a plurality of radio lobe coordinates is propagated by the machine-trained model, and that at least one relevance of the respective radio lobe associated with the radio lobe coordinates is provided in an output section of the further machine-trained model; a selection unit, which is configured in such a way that those radio lobe coordinates associated with an increased relevance are selected; and a or the raytracer, which is configured in such a way that at least one prediction of the at least one piece of channel state information based on the raytracer is ascertained on the basis of the selected radio lobe coordinates.

For the propagation simulation according to the raytracer, therefore, a selection of radio lobes to be simulated is used, as a result of which an acceleration of the calculation is achieved.

One further aspect of the present invention relates to a method. An example embodiment of the method according to the present invention includes: ascertaining or providing a piece of state information, which characterizes a simulated state of a spatial arrangement of components of the surroundings of the wireless communication network; ascertaining at least one prediction based on a machine-trained model, the state information being provided as an input parameter in an input section of a machine-trained model, the state information being propagated by the machine-trained model, and the at least one prediction of a piece of channel state information based on the machine-trained model, which characterizes a state of at least one radio channel between two communication models is provided in an output section of the machine-trained model.

In one advantageous example embodiment of the present invention, the method includes: ascertaining a plurality of pieces of state information as a function of a plurality of positions of a plurality of candidate trajectories of at least one component of the surroundings; ascertaining a respective prediction based on the machine-trained model for each of the plurality of pieces of state information; and selecting one of the candidate trajectories as a function of the plurality of the predictions assigned to one of the respective candidate trajectories.

In one advantageous example embodiment of the present invention, the method includes: ascertaining at least one prediction of the at least one piece of channel state information based on a raytracer as a function of the ascertained state information; and coordinating the operation of the model-based ascertainment unit and the raytracer.

In one advantageous example of the present invention, the method includes: comparing the state information, which characterizes the state of the surroundings of the wireless communication network, with a further piece of state information, which characterizes a further state of the surroundings of the wireless communication network; and activating either the model-based ascertainment unit or the raytracer for ascertaining the respective prediction as a function of the comparison.

In one advantageous example embodiment of the present invention, the further piece of state information represents at least a portion of training input data, with which the machine-trained model has been trained.

In one advantageous example embodiment of the present invention, the method includes: ascertaining with the aid of the machine-trained model a confidence level for the at least one prediction based on the machine-trained model; and activating the raytracer for ascertaining the prediction based on the raytracer as a function of the ascertained confidence level or providing the prediction based on the machine-trained model.

In one advantageous example embodiment of the present invention, the method includes: ascertaining or providing, in addition to the state information, a plurality of radio lobe coordinates, which are associated with at least one of the communication modules of the wireless communication network; providing the state information and the radio lobe coordinates as input parameters in an input section of the machine-trained model, the state information and at least one of a plurality of radio lobe coordinates being propagated by the machine-trained model, and at least one relevance of the respective radio lobes associated with the radio lobe coordinates being provided in an output section of the further machine-trained model; selecting those radio lobe coordinates that are associated with an increased relevance; and ascertaining at least one prediction of the at least one piece of channel state information based on the raytracer on the basis of the selected radio lobe coordinates.

One further aspect of the present invention relates to a device for training a model. In accordance with an example embodiment of the present invention, the device includes: an input unit, which is configured in such a way that a piece of state information, which characterizes a state of a spatial arrangement of components of the surroundings, is ascertained or provided; a raytracer, which is configured in such a way that at least one prediction of the at least one piece of channel state information based on the raytracer, which characterizes the state of the at least one radio channel between two communication modules of the surroundings, is ascertained as a function of the state information; a training set generator, which is configured in such a way that at least one training set including the state information and the assigned prediction based on the raytracer is ascertained; and a training unit, which is configured in such a way that the model is trained using the at least one training set.

The device according to the preceding aspect includes, in one example embodiment of the present invention, the input unit, which is configured in such a way that, in addition to the state information, a plurality of radio lobe coordinates, which are associated with at least one of the communication modules of the surroundings, are ascertained or provided; the raytracer, which is configured in such a way that the at least one prediction based on the raytracer and a relevance of the radio lobes associated with the radio lobe coordinates are ascertained as a function of the ascertained state and of at least one of the plurality of radio lobe coordinates; and the training set generator, which is configured in such a way that at least one training set including the state information, the assigned prediction based on the raytracer and the ascertained relevances is ascertained.

One further aspect of the present invention relates to a method for training a model. In an example embodiment of the present invention, the method includes: ascertaining or providing a piece of state information, which characterizes a state of a spatial arrangement of components of the surroundings; ascertaining at least one prediction of the at least one piece of channel state information based on the raytracer, which characterizes the state of the at least one radio channel between two communication modules of the surroundings, as a function of the state information; ascertaining at least one training set including the state information and the associated prediction based on the raytracer; and training the model using the at least one training set.

In one example embodiment of the present invention, the method includes: ascertaining or providing, in addition to the state information, a plurality of radio lobe coordinates, which are associated with at least one of the communication modules of the surroundings; ascertaining the at least one prediction based on the raytracer and a relevance of the radio lobes associated with the radio lobe coordinates as a function of the ascertained state and of at least one of the plurality of radio lobe coordinates; and ascertaining the at least one training set including the state information, the assigned prediction based on the raytracer and the ascertained relevances.

Other aspects of the present invention relate to a use of the device or of the method according to one of the preceding aspects.

DETAILED DESCRIPTION OF EXAMPLE EMBODIMENTS

FIG. 1 shows a device for controlling an industrial plant, in accordance with an example embodiment of the present invention.

Figure 2:
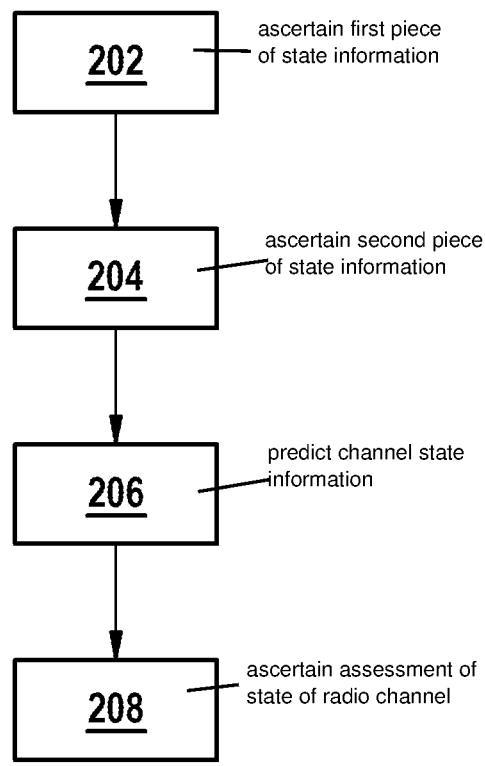
Figure 5:
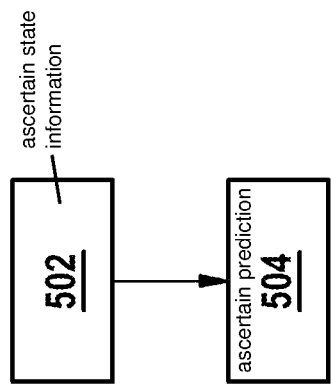

FIGS. 2 and 5 each schematically show a flowchart, in accordance with example embodiments of the present invention.

Figure 3:
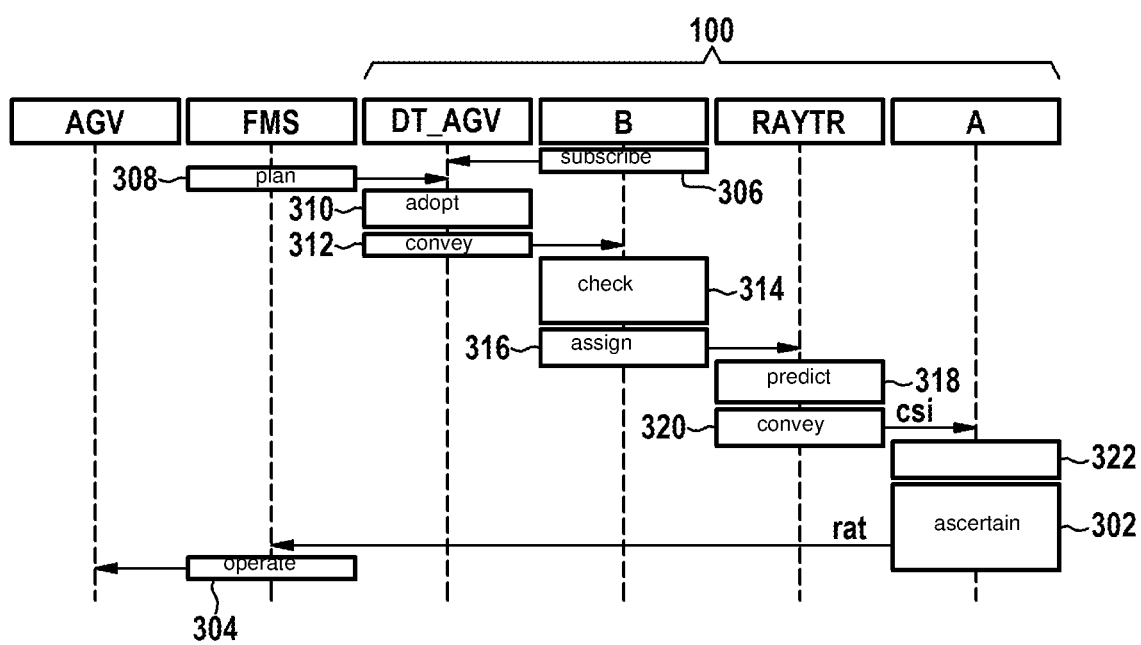
Figure 4:
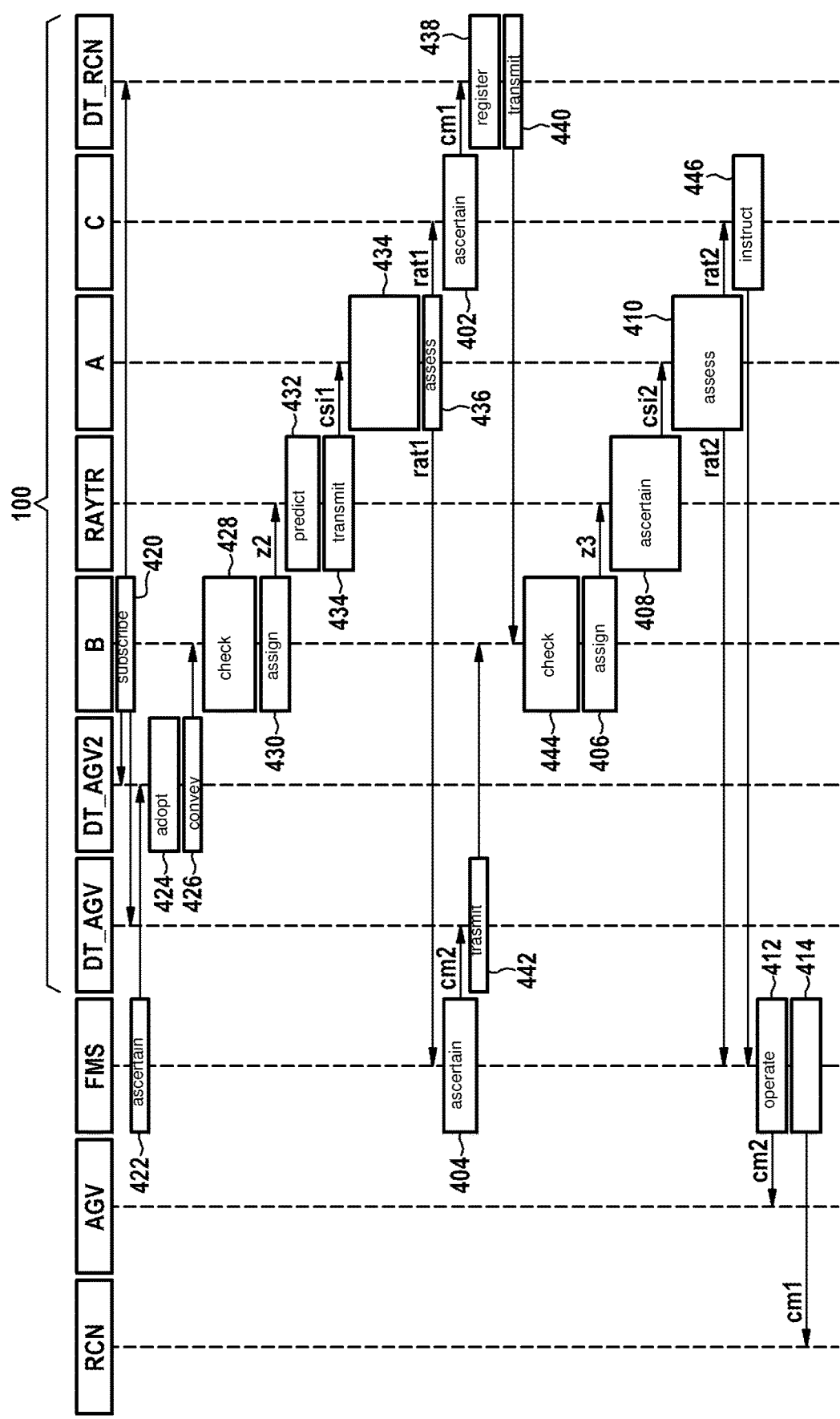

FIGS. 3 and 4 each schematically show a sequence diagram, in accordance with example embodiments of the present invention.

FIGS. 6 through 9 each schematically show block diagrams, in accordance with example embodiments of the present invention.

FIG. 10 shows a device for training a model, in accordance with an example embodiment of the present invention.

DETAILED DESCRIPTION OF EXAMPLE EMBODIMENTS

FIG. 1 shows a device 100 for an industrial plant FAC such as, for example, a production plant, a logistics center or a processing facility.

A state unit DT ascertains a first piece of state information z1, which characterizes an actual state of a spatial arrangement of components AGV, AP, RA of the surroundings of industrial plant FAC and at least one planned change of the spatial arrangement. State unit DT thus ascertains a representation of the instantaneous state of the spatial arrangement and/or of the wireless communication network RCN. The planned change includes, for example, a planned trajectory Tp1 of the component AGV and a planned trajectory Tp2 of the component RA.

An input unit B ascertains a second piece of state information z2 or z3, which characterizes a simulated future state of the spatial arrangement of components AGV, AP RA of the surroundings of industrial plant FAC, as a function of first piece of state information z1. The simulated state corresponds to a representation of the spatial arrangement, in which movable components AGV and RA are situated according to the planned change. The aforementioned representation thus includes, for example, digital twins of components AGV and RV, which are located on a respective point of the planned respective trajectory at a future point in time.

A state ascertainment unit SDU ascertains a prediction csi1, csi2 of a piece of channel state information, which characterizes a future potential state of at least one radio channel RCH between two communication modules CM_AP, CM_RA, each of which is associated with one of components AP, RA of the surroundings according to the second piece of state information, as a function of the second piece of state information z2. The state of the at least one radio channel RCH in the present case is degraded since, according to second piece of state information z2, component AGV is located between communication modules CM_RA and CM_AP and disrupts the line-of-sight.

An assessment unit A ascertains an assessment rat, for example, an expected deterioration of the state of radio channel RCH, as a function of prediction csi1, csi2 of the channel state information.

State ascertainment unit SDU includes, for example, a raytracer RAYTR. An information exchange takes place between a system made up of digital twins and raytracer RAYTR, in that the first or second piece of state information z1, z2, z3 are provided by the digital twins of components AGV, AP, RA. The instantaneous and future status information of the radio system and the propagation conditions, for example, channel characteristics, reception power, signal quality, expected data rate, etc. are provided. Predictions csi are responded to by pieces of information being forwarded according to control unit FMS to the manufacturing management system "Factory Management System" or by the control unit being instructed.

Since the digital twins in one example are used for the management of the manufacturing processes, the latter may be explicitly adapted to predicted radio channel conditions.

Since raytracer RAYTR has access to pieces of information of the digital twins, and thus to data from the manufacturing process, an additional intelligent unit C may optimize wireless communication network RCN to the extent that it proactively adapts network parameters in order to operate the industrial applications in a highly reliable manner. In this process, raytracer RAYTR simulates various configurations of the mobile communication network while taking the future, dynamic changes in the manufacturing surroundings according to the state information into account, and provides expected channel conditions according to the prediction.

If, therefore, a deterioration is expected according to assessment rat, countermeasures cm1, cm2 are then ascertained and checked. A countermeasure cm1 could, for example, be that the spatial area between components AP and RA is declared a forbidden zone, into which component AGV is not permitted to enter. Accordingly, the previously planned trajectory Tp1 for component AGV must be discarded and replaced by a trajectory to be newly planned. In contrast, trajectory Tp2 of component RA is maintained. In this way, communication module CM_RA of the robot arm is able to communicate with the communication module CM_PA of the access point without disrupting radio channel RCH.

Model-based ascertainment unit MBU of state ascertainment unit SDU in one example is configured in such a way that state information z2, z3 is provided as an input parameter in an input section of a machine-trained model M, that state information z2, z3 is propagated by machine-trained model M, and that at least one prediction csi1, csi2, csiM of a piece of channel state information based on machine-trained model M is provided, which characterizes a future potential state of at least one radio channel RCH between the two communication modules CM_AP, CM_RA, each of which is associated with one of components AP, RA of the surroundings according to state information z2, z3.

State ascertainment unit SDU in one example includes both model-based ascertainment unit MBU as well as raytracer RAYTR.

State ascertainment unit SDU in one example includes model-based ascertainment MBU but not raytracer RAYTR.

State ascertainment unit SDU in one example includes raytracer RAYTR but not model-based ascertainment unit MBU.

Model M is, for example, an artificial neural network, a Gaussian process, or a Bayesian neural network.

State information z, z1, z2, z3 includes, for example, a 3D-map of the surroundings. The pieces of state information include, for example, pieces of information about the components of the industrial plant or of the manufacturing system, which impact the communication system, for example, a position, orientation and speed of a component AGV, a position, orientation and operating state of the large machine, a position and orientation of the individually moveable parts of a robot arm RA.

Propagation mechanisms, reflection, diffraction and scattering influence pure free field propagation according to a line-of-sight. The spatial arrangement of components includes three-dimensional model and the condition of the respective surfaces, in order to take the propagation mechanisms into account. Raytracer RAYTR ascertains prediction csi1, csi2 as a function of the spatial arrangement and of the condition of the respective surfaces of the components while taking the propagation mechanisms into account. Prediction csi1, csi2 is, for example, a link budget or a power transfer balance, which is a measure of the quality of radio channel RCH. Raytracer RAYTR carries out a raytracing of at least a portion of the radio signals in the surroundings predefined by state information z2. In this case, a spatial segmentation may also take place in order to accelerate the raytracing and to achieve the computational efficiency and accuracy for the propagation modeling. 3D models according to the ascertained spatial arrangement in terms of first, second or third piece of state information z1, z2, z3 are used in order to produce realistic models for the propagation surroundings. The position and extent of the components characterize the propagation of the electromagnetic waves.

Raytracer RAYTR is, for example, a software solution, which is used for the analysis and assessment of the radio wave propagation both in the indoor area as well as in the outdoor area. Raytracer RAYTR is based on a three-dimensional model of the propagation surroundings, on the basis of which transmission paths (rays) emitted—generally from the antenna of a base station—are generated and analyzed. In the process, reflections, diffraction and scattering in the wave propagation are simulated in order to obtain a realistic analysis pattern of the propagation surroundings. In particular, during ray launching of a form of the ray tracing, a particular number of signal paths are emitted originating from the antenna, which is a function of the selected resolutions of the azimuth angle and elevation angle with the center of the antenna as the basis. Once reflection, diffraction and refraction are considered, the incident paths are added at defined reception points, generally locations of the antennas of the receivers, and on the basis of which the channel characteristics are simulated.

Component AGV is, for example, an autonomous guided vehicle. Component AP is, for example, an access point. Component RA is, for example, a robot arm. In one example, ascertainment unit DT receives the first piece of state information in the form of measured values or signals s_FAC from the surroundings. In another example, first ascertainment unit DT includes digital twins of the spatial individual components of industrial plant FAC, which ascertain from received further state information a representation of industrial plant FAC at an actual point in time. Thus, first piece of information z1 corresponds to a representation of the spatial arrangement of industrial plant FAC in the present.

Ascertainment unit or input unit B includes, for example, digital twins of spatial components AGV, AP, RA of industrial plant FAC. Thus, second piece of state information z2 corresponds to an estimated, i.e., predicted representation of the spatial arrangement of the individual components of industrial plant FAC in the future.

Digital twins, or systems of multiple digital twins, are virtual representations of physical devices and of processes and sequences in industrial manufacturing. The aim of digital twins is to retrieve the status of the production operations in real time, to control and to optimize these, as well as to manage the life cycle of such devices. To represent the physical devices in real time, the former send, among other things, pieces of status information of physical characteristics measured by sensors to a central processing unit, which then virtually maps the real state of the system and of the processes. In this case, three-dimensional CAD models, for example, are also used in order to generate an exact and true-to-detail visual representation of the physical objects. The result in real time is an accurate, dynamic and three-dimensional image of all systems, machines, robots and other devices, as well as their interactions, processes and sequences.

Channel state information csi thus corresponds to a prediction of the radio conditions, which prevail in the future state of the spatial arrangement ascertained with the aid of second piece of state information z2.

Second piece of state information z2 includes a three-dimensional future representation of the components of industrial plant FAC as well as their future positions within industrial plant FAC.

Device 100 assesses the instantaneous and prognosticated situation in the surroundings of industrial plant FAC and ascertains an instruction i, which is fed to a control unit FMS. Instruction i includes, for example, one of countermeasures cm1, cm2 or an enabling of the change of the spatial arrangement. Control unit FMS ascertains as a function of instruction i at least one control signal s_C, which is used for controlling one of components AGV, AP or RA. Control unit FMS ascertains as a function of instruction i at least one control signal s_RCN, which is used for controlling one of communication modules CM1, CM2.

Raytracer RAYTR includes functionalities, which update the channel propagation conditions in real time when changes are made in the manufacturing surroundings. For this purpose, raytracer RAYTR obtains pieces of information of the other digital twins prepared by input unit B. Such pieces of information may, for example, be: updated, three-dimensional models of the physical systems "plant assets"; movement trajectories of robot arms, AGVs, systems and other objects; surface conditions of the objects; design of the manufacturing facility; process and manufacturing schedules; radio channel measured data of mobile users; and others. For this purpose, input unit B subscribes to these pieces of information, for example, with the aid of a publish/subscribe system. Functions of input unit B, which are aimed at a real-time capable and exact prediction of the channel conditions, are:

a) Input unit B forwards the obtained pieces of information to raytracer RAYTR, which then updates the channel propagation conditions, for example, using an updated three-dimensional situational picture.

b) Input unit B decides whether and when updated pieces of information about channel propagation conditions are required. If this is the case, for example, if an AGV blocks the direct line-of-sight between two other communication nodes, input unit B instructs raytracer RAYTR to produce an updated image of the channel propagation conditions.

c) Input unit B analyzes manufacturing schedules, which contain, for example, planned trajectories of AGVs, and thereupon instructs raytracer RAYTR to ascertain the channel propagation conditions over a future period of time, for example, over a period of a cyclical movement of a robot arm or over a certain trajectory of a mobile user, for example, AGV.

d) Input unit B forwards radio channel measures of the users to raytracer RAYTR, in order to compare predicted values and in order to improve future raytracing results.

e) Input unit B or raytracer RAYTR decides on the basis of available pieces of information and of the history to what degree and with what degree of accuracy the raytracing is to be carried out. For example, a subset of all possible radiation angles, azimuth angles and elevation angles may be selected if only one object moves at a particular location in the manufacturing facility. Or the number of the reflections of the individual paths considered may be reduced.

f) Input unit B replaces successive functions of the raytracer by replacing raytracing calculation models with calculation models based on machine learning in order to accelerate the calculation of the channel propagation conditions. For example, a neural network learns the correlations between the status of the manufacturing environment, the pieces of information of the digital twins available to input unit B and the real channel conditions or channel conditions predicted by raytracer RAYTR in terms of the prediction.

Assessment unit A is used for representing and further considering the results of raytracer RAYTR. In one example, assessment unit A visualizes the instantaneous real and/or predicted channel conditions, for example, in the form of the signal strength or signal quality. In one example, assessment unit A visualizes the instantaneous and the future channel conditions. Assessment unit A informs the manufacturing management system "factory management system" or control unit FMS when future channel conditions deteriorate or threaten to fall below a threshold value. Assessment unit A instructs control unit FMS to initiate countermeasures if, for example, in the case of a planned trajectory of a mobile user the radio connection thereof threatens to abort or the required demands of the communication system are no longer able to be met. One countermeasure is, for example, to change the planned route of an AGV and to formalize it in the manufacturing schedule.

Countermeasures ascertainment unit C is used to inform and to proactively control and optimize the wireless communication network. This occurs either directly within the wireless communication network, if countermeasures ascertainment unit C is part thereof, or either via the manufacturing management system or the digital twin of the communication system "digital PCS twin," if countermeasures ascertainment unit C is part of the system of digital twins. Countermeasures ascertainment unit C is able to implement the following functions: countermeasures ascertainment unit C forwards merely pieces of information about future channel conditions to the radio system for further processing and consideration. Countermeasures ascertainment unit C predicts with the aid of raytracer RAYTR and of the digital twin virtually for various network configurations the channel conditions and submits them to the radio communication system as a basis of decision-making for the optimization. The selection of the various network configurations to be tested affects either the wireless network or countermeasures ascertainment unit C itself. Countermeasures ascertainment unit C has knowledge of the possible adaptations of network parameters of the wireless network, which may have a direct or indirect influence on channel conditions. Such network parameters are, for example, transmission power, antenna parameters, interference coordination schemes, handover parameters, beam-forming settings, MIMO configurations, and others. In another example, countermeasures ascertainment unit C triggers a decision about the network configuration to be adopted and instructs the wireless network and its communication module accordingly.

FIG. 2 schematically shows a sequence diagram for operating device 100 from FIG. 1. According to a step 202, the first piece of state information is ascertained, which characterizes the actual state of the spatial arrangement of components of the surroundings and at least one planned change of the spatial arrangement. In a step 204, the second piece of state information is ascertained, which characterizes the simulated state of the spatial arrangement of the components of the surroundings, as a function of the first piece of state information. In a step 206, the prediction of the channel state information, which characterizes the state of the at least one radio channel between two communication modules, is ascertained as a function of the second piece of state information. In a step 206, an ascertainment of the assessment of the state of the radio channel takes place as a function of the prediction of the channel state information.

FIG. 3 schematically shows a sequence diagram for operating device 100. Input unit B subscribes according to a step 306 to data of a digital twin DT_AGV of component AGV, which represents the behavior and the state of component AGV. In step 308, control unit FMS plans a new trajectory in terms of the planned change, which is adopted in step 310 by digital twin DT_AGV. A step 312 conveys to input unit b that the newly planned trajectory is present. Input unit B checks the newly planned trajectory in a step 314 in terms of whether this trajectory has or could have potential influence on a radio wave propagation or whether an influence on the radio wave propagation is relevant, in order to carry out a more exact check. If the foregoing is affirmed, then raytracer RAYTR is assigned in step 316 with carrying out a calculation of the radio wave propagation in the surroundings and under the assumption that component AGV would move along the planned trajectory. In a step 318, predictions csi for the radio wave propagation or for the channel states are ascertained and conveyed in step 320 to assessment unit A. Assessment unit A ascertains in step 302 assessment rat which, in the present case, indicates a sufficient quality of the state of the at least one radio channel RCH, as a function of the prediction csi. In step 304, control unit FMS operates the at least one component AGV of industrial plant FAC with the at least one planned change if the sufficient quality is ascertained. Thus, assessment unit A enables the planned change in terms of the planned trajectory for component AGV, so that control unit FMS instructs component AGV to move along the planned trajectory.

FIG. 3 schematically shows a sequence diagram for operating device 100. In a step 420, input unit B subscribes to the data of digital twins DT_AGV, DT_ADV2 and DT_RCN of components AGV, AGV2 and of wireless communication network RCN. Control unit FMS ascertains in step 422 a newly planned trajectory for second component AGV2, for example, a second autonomous guided vehicle, and conveys this trajectory to digital twin DT_AGV2, which is adopted in step 424. A step 426 conveys to input unit B that the newly planned trajectory is present. Input unit B checks the newly planned trajectory in a step 428 in terms of whether this trajectory potentially has/could have an influence on a radio wave propagation or whether an influence on the radio wave propagation is relevant in order to carry out a more exact check. If the foregoing is affirmed, then raytracer RAYTR is assigned in step 430 with carrying out a calculation of the radio wave propagation in the surroundings on the basis of state information z2, and under the assumption that component AGV2 would move along the planned trajectory. In a step 432, predictions csi1 are ascertained for the radio wave propagation or for the channel states and transmitted in step 434 to assessment unit A. Assessment unit A ascertains in a step 434 that at least one of the radio channels would possess an insufficient quality if the planned trajectory were carried out by component AGV2. A corresponding assessment rat1 is sent in step 436.

A countermeasures-ascertainment unit C or control unit FMS are used to ascertain 402, 404 the at least one countermeasure cm1, cm2, which characterizes a change of the spatial arrangement and/or of a parameter of wireless communication network RCN, if ascertained assessment rat1 indicates a likely deterioration of the state of the at least one radio channel RCH. The aim of countermeasure cm1, cm2 is that the ascertained future deterioration of radio channel RCH of wireless communication network RCN of industrial plant FAC does not occur.

A digital twin DT_RCN obtains first countermeasure cm1 for increasing a transmission power of component AP and registers this in a step 438. The change of the information is transmitted to input unit B in a step 440.

Second countermeasure cm2 is transmitted to digital twin DT_AGV of component AGV in order, for example, to implement a line-of-sight not existing in the actual state of wireless communication network RCN by the component moving along a trajectory according to countermeasure cm2. Digital twin DT_AGV transmits in a step 442 the pieces of information according to countermeasure cm2 to input unit B.

Input unit B checks in a step 444 planned countermeasure cm1, cm2 in terms of whether this countermeasure potentially has/could have an influence on a radio wave propagation or whether an influence on the radio wave propagation is relevant in order to carry out a more exact check. If the foregoing is affirmed, then raytracer RAYTR is assigned in step 406 with carrying out a calculation of the radio wave propagation in the surroundings.

Input unit B ascertains in a step 406 a further piece of state information z3, which characterizes a further future state of the spatial arrangement of components AGV, AP, RA of industrial plant FAC, as a function of state information z1 and of the at least one countermeasure cm1, which characterizes a change of the spatial arrangement.

State ascertainment unit SDU ascertains a further prediction csi2 of the channel state information as a function of the further piece of state information z3 and/or of the countermeasure, which characterizes a change of the parameter of wireless communication network RCN.

In a step 410, assessment unit A ascertains assessment rat2, which indicates a sufficient quality of the state of at least the radio channel RCH in terms of the assessment of further prediction csi2 of the channel state information.

In a step 446, unit C instructs control unit FMS to increase the transmission power of component AP of wireless communication network RCN according to countermeasure cm1.

In a step 412, control unit FMS operates industrial plant FAC with the at least one ascertained countermeasure cm1, cm2 if the sufficient quality is ascertained for further prediction csi2.

The ascertainment of the at least one countermeasure cm1 includes an ascertainment of at least one trajectory for one of components AGV, AP, RA. A planned trajectory of one of components AGV, AP, RA is replaced by the ascertained trajectory if the sufficient quality of the state of the radio channel is ascertained.

Thus, first piece of state information z1 includes, for example, planned trajectories and second piece of state information z2 includes the state, which is achieved by following the planned trajectories. Countermeasure cm1 may thus include a 'critical zone', which is represented by a spatial boundary. This 'critical zone' means for control unit S of industrial plant FAC that none of the mobile or semi-mobile components of the industrial plant are allowed to enter this 'critical zone' and no components are allowed to be moved within the 'critical zone.' Accordingly, the trajectory for one of components AGV, AP, RA is ascertained, which replaces the previously planned trajectory.

The ascertainment of the at least one countermeasure cm2 includes ascertaining at least one transmission and/or reception parameter of at least one of communication modules CM_AP, CM_RA. A planned use or retention of a transmission and/or reception parameter is discarded. Instead, the ascertained transmission and/or reception parameter is used and/or considered for a particular period of time if the sufficient quality of the state of the radio channel is ascertained.

For example, the transmission power and/or reception power for sending and/or receiving radio signals on radio channel RCH in one or both communication modules CM_AP, CM_RA is increased in order to thus increase the reception probability. Further parameters include, for example, a modulation and coding scheme, a subchannel, etc.

FIG. 5 schematically shows a flowchart for operating device 100 from FIG. 1. According to a step 502, a piece of state information, which characterizes the simulated state of the spatial arrangement of components AGV, AP, RA of the surroundings of the wireless communication network, are ascertained and/or provided. A step 504 includes an ascertainment of at least one prediction based on the machine-trained model, the state information being provided as an input parameter in an input section of the machine-trained model, the state information being propagated by machine-trained model M, and the at least one prediction of the channel state information based on machine-trained model M, which characterizes a state of the at least one radio channel between two communication modules, each of which is associated with one of the components of the surroundings according to the state information, being provided in an output section of machine-trained model M.

Figure 6:
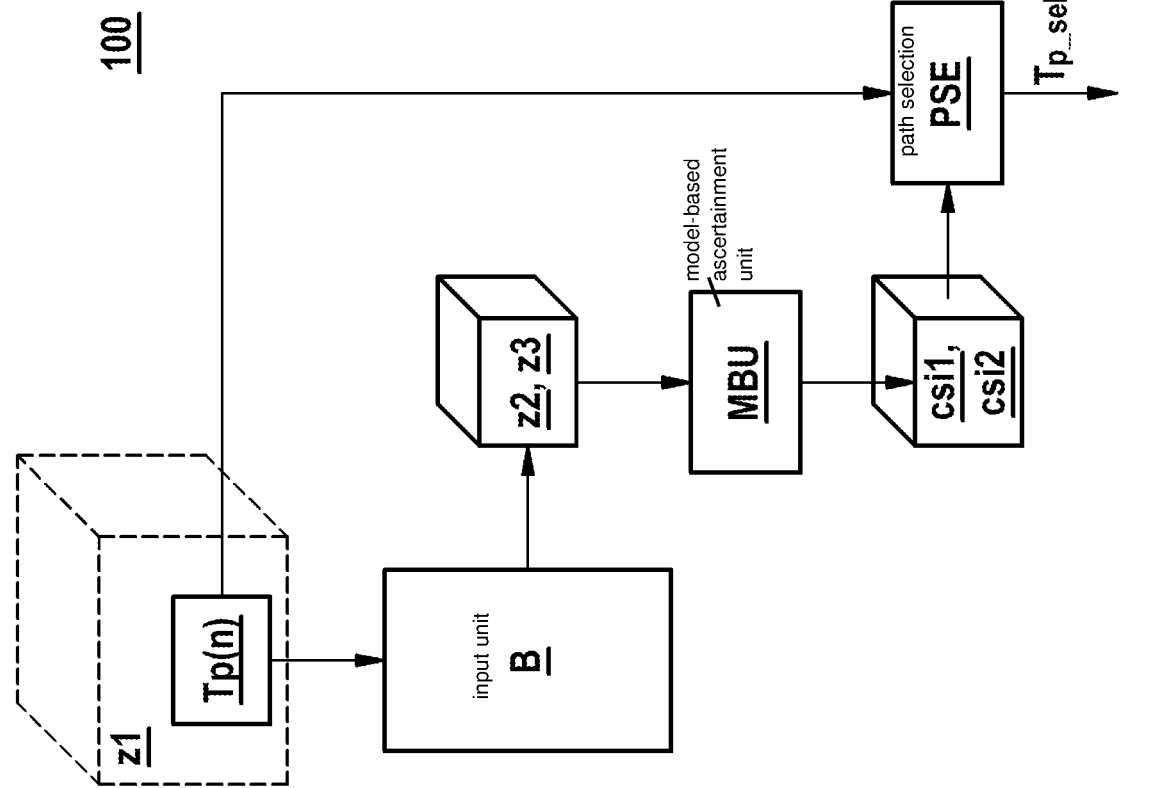

FIG. 6 shows device 100 from FIG. 1. Input unit B is configured in such a way that a plurality of pieces of state information z2, z3 are ascertained as a function of a plurality of positions of a plurality of candidate trajectories Tp(n) of at least one component of the surroundings. In each candidate trajectory Tp(n), n indicates the respective candidate trajectory of a number N of candidate trajectories.

Model-based ascertainment unit MBU is configured in such a way that for each of the plurality of pieces of state information z2, z3, a respective prediction csi1, csi2 is ascertained based on machine-trained model M.

A path selection unit PSE is configured in such a way that one of candidate trajectories Tp(n) is selected as a function of the plurality of predictions csi1, csi2 assigned to one of respective candidate trajectories Tp(n). For example, trajectory TP_sel is selected, which exhibits the highest average quality for the investigated radio channels and, at the same time, the quality of the respective radio channels does not drop below a minimum.

If a trajectory for a component AGV is to be established, the model is used in order to assess the costs for candidate trajectories. The model ascertains the y-outputs, i.e., the predictions, and their distribution for each of the candidate paths. These pieces of information may be used in order to calculate the costs of the candidate path, for example, by choosing the path with at least a minimal SINR over the entire trajectory. This cost assessment may take place on an equidistant discretization of the path with a predefined step size or may be automated. Various candidate tracks may be classified in this way. If the candidate trajectories are parameterized, an optimization algorithm may be used in order to determine the optimal trajectory. The model allows a response in real time to changed surroundings conditions, which is not possible with the classical raytracing technology.

Figures 7, 8, 9:
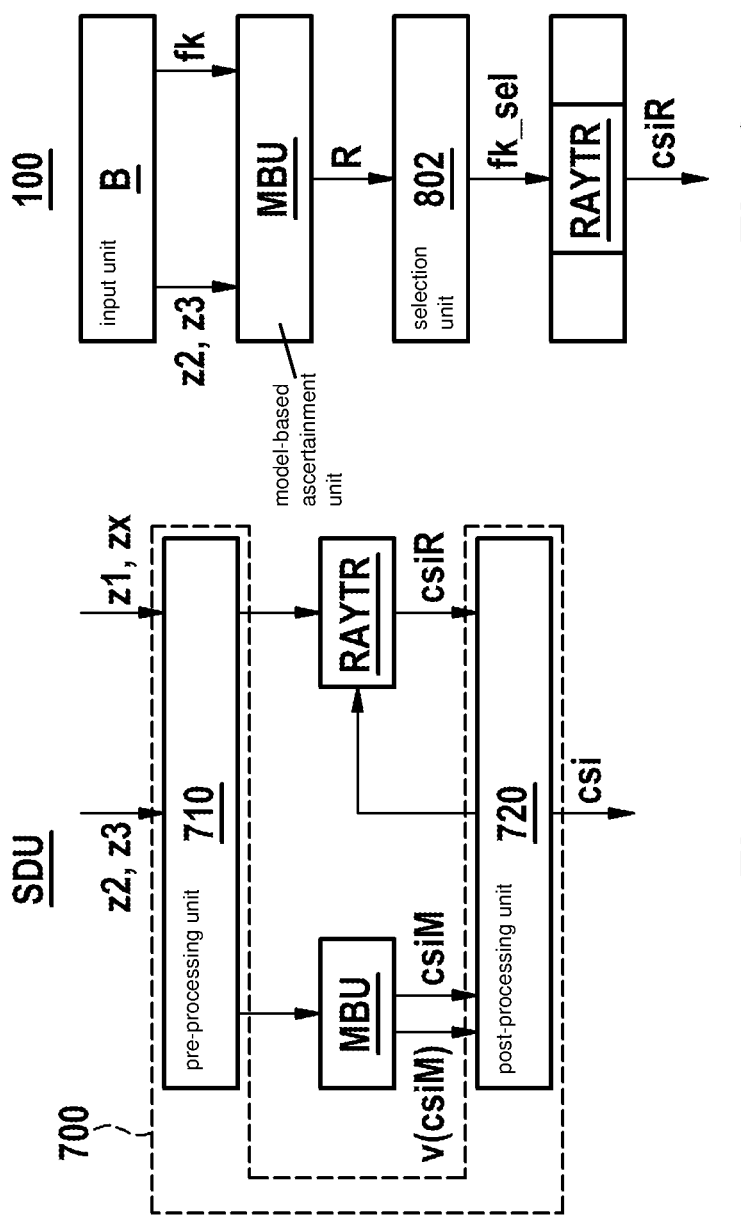

FIG. 7 shows state ascertainment unit SDU in a schematic block diagram. Raytracer RAYTR is configured in such a way that at least one prediction csiR of the at least one piece of channel state information based on raytracer RAYTR is ascertained as a function of the ascertained piece of state information z2, z3.

A coordination unit 700 is configured in such a way that the operation of model-based ascertainment unit MBU and of raytracer RAYTR is coordinated.

A pre-processing unit 710 of coordinating unit 700 is configured in such a way that state information z2, z3 which characterizes the state of the surroundings of the wireless communication network is compared with a further piece of state information z1, zx, which characterizes a further, temporally offset to the previous, state or a previously established state of the surroundings of the wireless communication network, and that either model-based ascertainment unit MBU or raytracer RAYTR is activated for ascertaining the respective prediction as a function of the comparison.

Thus, the machine-trained model is used as a substitute for the raytracing function in particular situations, for example, if only a few objects change their position. In repeating and/or only slightly changing surroundings, the model is able to provide a sufficiently high degree of accuracy. The output of the raytracer is learned for a predefined set of surroundings conditions. Model M machine-trained in this way is used as a real-time channel prediction engine if such a surroundings situation occurs.

Context data and/or application data relating to the manufacturing processes are used in one example for augmenting the data input for the trained model. In this case, digital twins of the industrial plant provide pieces of information about deterministic changes of the surroundings.

For example, the further piece of state information zx represents at least a portion of training input data with which the machine-trained model has been trained.

Bayesian neural networks or Gaussian processes ascertain a distribution in terms of a confidence level v(csiM) in addition to the output in terms of prediction csiM of the channel condition. This confidence level v(csiM) of the output is used to decide whether the prediction of the model is used or whether additional data points from raytracer RAYTR are required. Model-based ascertainment unit MBU is therefore configured in such a way that the confidence level vcsiM for the at least one prediction csiM based on machine-trained model M is ascertained with the aid of machine-trained model M.

During active learning, those input data that provide the most pieces of information are selected, entropy, for example, in the case of Gaussian processes, measured in the form of the predictive variance. In less dynamic situations, for example, at night, model-based ascertainment unit MBU or coordination unit 700 triggers raytracer RAYTR in order to obtain data points for fewer discovered regions of the surroundings. If many productions lines are newly arranged the next morning, the model may be accordingly trained to learn how the signal conditions will be, the active learning being restricted to those input dimensions that will probably change tomorrow.

A post-processing unit 720 of coordination unit 700 is configured in such a way that raytracer RAYTR is activated for ascertaining prediction csiR based on raytracer RAYTR as a function of ascertained confidence level vcsiM or prediction csiM based on the machine-trained model is provided for further processing as prediction csi.

FIG. 8 shows in a schematic block diagram a part of device 100. Input unit B is configured in such a way that in addition to state information z2, z3, a plurality of radio lobe coordinates fk, which are associated with at least one of the communication modules of the wireless communication network, are ascertained or provided. Model-based ascertainment unit MBU is configured in such a way that state information z2, z3 and radio lobe coordinates fk are provided as input parameters in an input section of the machine-trained model, that state information z2 or z3 and at least one of a plurality of radio lobe coordinates fk is propagated by the machine-trained model, and that at least one relevance R of each radio lobe associated with radio lobe coordinates fk is provided in an output section of the further machine-trained model. After one or multiple forward-propagation passes, a plurality of relevances R of radio lobes is provided.

A selection unit 802 is configured in such a way that those radio lobe coordinates fk_sel associated with an increased relevance R are selected.

Raytracer RAYTR is configured in such a way that at least one prediction csiR of the at least one piece of channel state information based on raytracer RAYTR is ascertained on the basis of selected radio lobe coordinates fk_sel.

For example, the respective relevance R of the radio lobe characterizes a reception strength of the radio lobe at one of the receiving communication modules of the wireless communication network. The processing is thus accelerated by raytracer RAYTR since not all, but only the radio lobes according to radio lobe coordinates fk_sel that are of increased relevance R, are required to be simulated. The ascertainment of prediction csiR of the channel state information is therefore accelerated. Thus, the dominant/relevant rays are ascertained for the calculation with the raytracer. The measure of the relevance of a ray may be its reception strength at the point of interest, i.e., of one of the communication modules. The number of dominant rays may be ascertained by considering the rays whose reception power is at most 20 dB below that of the most dominant ray, optionally: when using probabilistic models "at most 20 dB below that of the most dominant ray with sufficiently high user-determined probability." A dominant ray is characterized by its spherical coordinates, the tupel theta, phi direction of the radiation from the focus of the antenna of the base station. The model learns the relationship between theta, phi, x=>R, R standing for the relevance of the ray with the spherical coordinates theta and phi. If changes then occur in the surroundings or are to be expected by providing pieces of information about future states of the digital twins, module M calculates relevance R for each tupel theta, phi while taking into account in advance the future state information of the surroundings and prompts raytracer RAYTR to update the radio wave surroundings by calculating only rays that are specified by a set of tupels theta, phi, which have a relevance R above a particular threshold value.

FIG. 9 shows in schematic form a device 900 for training the model. Input unit B is configured in such a way that a piece of state information z, which characterizes the state of a spatial arrangement of components of the surroundings, is ascertained or provided. Raytracer RAYTR is configured in such a way that at least prediction csiR of the at least one piece of channel state information based on raytracer RAYTR, which characterizes the state of the at least one radio channel between two communication modules of the surroundings, is ascertained as a function of state information z. A training set generator 902 is configured in such a way that at least one training set is including state information z and assigned prediction csiR based on raytracer RAYTR is ascertained. A training unit 1000, which is configured in such a way that the model is trained using the at least one training set ts.

State information z includes, for example, a 3D map of the surroundings. The pieces of state information include, for example, pieces of information about the components of the industrial plant or of the manufacturing system, which impact the communication system, for example, a position, orientation and speed of a component AGV, a position, alignment and operating state of the large machine, a position and alignment of the individually movable parts of a robot arm RA.

Thus, one starts, for example, with predictions obtained by raytracing in order to generate training data ts for the model. Model M learns the mapping between x surroundings variables and y transmission KPIs such as channel pulse responses, reception powers, SINR or even data rates using data that are generated by raytracing, i.e., labelled x,y tupels.

The training of model M may be carried out by active learning.

In one example, the impact of the stochastic dynamics of the surroundings on the radio channel, the coverage and LOS are learned. Stochastic influences may be inaccuracies of the 3D representations of systems and randomly or unexpectedly moving objects or persons on the factory floor. The 3D surroundings provided to the raytracer are modified by additional moving objects, which are to be expected in the planned surroundings. As a result, multiple pieces of state information will include the unexpected components in the surroundings, which are simulated and provided for training the model.

In one example, transfer-learning is utilized in order to make the model more versatile for a multitude of similar surroundings states, situations and scenarios. Here it is assumed that various industrial plants are identical to one another and/or include the same components. Or multiple "similarly appearing" production lines in a manufacturing facility are taken as a starting point. In such cases, there are similarities with respect to the radio environment, which means that the model is not absolutely required to learn the propagation characteristics from the ground up. Thus, the structure of a data-based model, for example, the parameterization of a neural network, may be reused in another, but similar, surroundings.

In one example, input unit B ascertains lobe coordinates fk and raytracer RAYTR ascertains relevance R appropriate to lobe coordinates fk. Training data ts thus include prediction csiR, relevance R associated therewith as well as state information z. Input unit B is thus configured in such a way that in addition to state information z, a plurality of radio lobe coordinates fk, which are associated with at least one of the communication modules of the surroundings, are ascertained or provided. Raytracer RAYTR is configured in such a way that the at least one prediction csi based on raytracer RAYTR and relevance R of the radio lobes associated with radio lobe coordinates fk are ascertained as a function of ascertained state z, z1, z2 and of at least one of the plurality of radio lobe coordinates fk. Training set generator 902 is configured in such a way that the at least one training set ts including state information z, assigned prediction csi based on raytracer RAYTR, and ascertained relevances R, is ascertained.

FIG. 10 shows an arrangement or training unit 1000 for training model M. Reference is made, for example, to artificial neural network NN. Alternatively, other data-based models such as, for example, Gaussian processes may of course also be used.

Training data eiTrain are provided in the form of input data via an input interface 1008. The arrangement is made up of the data-based model, for example, artificial neural network NN including an input layer. For a time step i, an input tensor of input data id, for example, of the pieces of state information, is transferred to the input layer. The input layer is part of the input section. For input data id, output O in the form of prediction csi is determined from the previous figures. In time step i, a tensor including observation values oitrain is determined from output O, which are assigned to the observation values of tensor eitrain. Each of the time series of input data id is assigned to one of three input nodes. In a forward path of artificial neural network NN, the input layer is followed by at least one hidden layer. In the example, a number of nodes of the at least one hidden layer is greater than a number of the input nodes. This number is to be regarded as a hyperparameter. In the example, four nodes are provided in the hidden layer. Neural network NN is learned, for example, by the gradient descent method in the form of back propagation.

In the forward path, an output layer 1010 is provided in the example after at least one hidden layer. Prediction values are output on output layer 1010 of the output part of neural network NN. Each prediction value in the example is assigned an output node.

In each time step i, a tensor o'itrain is determined, in which the prediction values for this time step i are contained. This tensor is fed in the example together with the column vector of observations values oitrain to a training device 1002. Training device 1002 in the example is designed for the purpose of determining a prediction error with the aid of a loss function LOSS, in particular, with the aid of a mean square error, and to train model M therewith and with the aid of an optimizer, in particular, an Adam optimizer. Loss function LOSS in the example is determined by the values of the tensor of observation values oitrain and of the tensor of prediction values o'itrain as a function of a deviation, in particular of the mean square error.

The training is completed once a fixed criterion is met. In the example, the training is aborted if the loss does not decrease over multiple time steps, i.e., in particular, the mean square error does not decrease.

The test data are then input into model M trained in this manner. Model M is generated by the training with the training data. Model M is evaluated with the test data, in particular, with respect to mean value $\mu$ and of covariance S.

What is claimed is:

1. A device, comprising:
an input unit configured in such a way that a piece of state information, which characterizes a simulated state of a spatial arrangement of components of surroundings of a wireless communication network, is ascertained or provided;

a model-based ascertainment unit configured in such a way that the state information is provided as an input parameter to an input section of a machine-trained model, the state information is propagated by the machine-trained model, and at least one prediction of a piece of channel state information based on the machine-trained model, which characterizes a state of at least one radio channel between two communication modules of the wireless communication network, is provided in an output section of the machine-trained model;

a raytracer configured in such a way that at least one prediction of the at least one piece of channel state information based on the raytracer is ascertained as a function of the ascertained state information; and a coordination unit configured in such a way that operation of the model-based ascertainment unit and of the raytracer is coordinated;

wherein the model-based ascertainment unit is configured in such a way that a confidence level for the at least one prediction based on the machine-trained model is ascertained using the machine-trained model, and wherein the device further comprises:

a post-processing unit of the coordination unit, the post-processing unit being configured in such a way that the raytracer is activated for ascertaining the prediction based on the raytracer, or the prediction based on the machine-trained model is provided as a function of the ascertained confidence level.

2. The device as recited in claim 1, wherein the input unit is configured in such a way that a plurality of pieces of state information are ascertained as a function of a plurality of positions of a plurality of candidate trajectories of at least one of the components of the surroundings, wherein the model-based ascertainment unit is configured in such a way that a respective prediction based on the machine-trained model is ascertained for each of the plurality of pieces of state information, and wherein the device further comprises:

a path selection unit configured in such a way that one of the candidate trajectories is selected as a function of the plurality of the predictions assigned to one of the respective candidate trajectories.

3. The device as recited in claim 1, wherein the coordination unit includes:

a pre-processing unit configured in such a way that the state information, which characterizes the state of the surroundings of the wireless communication network, is compared with a further piece of state information, which characterizes a further state of the surroundings of the wireless communication network, and that either the model-based ascertainment unit or the raytracer is activated for ascertaining the prediction based on the machine-trained model or the prediction based on the raytracer as a function of the comparison.

4. The device as recited in claim 3, wherein the further piece of state information represents at least one part of training input data, with which the machine-trained model has been trained.

5. A device, comprising:

an input unit configured in such a way that a piece of state information, which characterizes a simulated state of a spatial arrangement of components of surroundings of a wireless communication network, is ascertained or provide;

a model-based ascertainment unit configured in such a way that the state information is provided as an input parameter to an input section of a machine-trained model, the state information is propagated by the machine-trained model, and at least one prediction of a piece of channel state information based on the machine-trained model, which characterizes a state of at least one radio channel between two communication modules of the wireless communication network, is provided in an output section of the machine-trained model;

wherein the input unit is configured in such a way that a plurality of radio lobe coordinates, which are associated with at least one of the communication modules of the wireless communication network, are ascertained or provided, wherein the model-based ascertainment unit is configured in such a way that the state information and the radio lobe coordinates are provided as input parameters to the input section of the machine-trained model, the state information and at least one of a plurality of radio lobe coordinates is propagated by the machine-trained model, and that at least one relevance of a respective radio lobe associated with the radio lobe coordinates is provided in the output section of the machine-trained model, and wherein the device further comprises:

a selection unit configured in such a way that those radio lobe coordinates associated with an increased relevance are selected; and a raytracer configured in such a way that at least one prediction of the at least one piece of channel state information based on the raytracer is ascertained on the basis of the selected radio lobe coordinates.

6. A method, comprising the following steps:

ascertaining or providing a piece of state information, which characterizes a simulated state of a spatial arrangement of components of surroundings of a wireless communication network; and ascertaining at least one prediction based on a machine-trained model, the state information being provided as an input parameter in an input section of the machine-trained model, the state information being propagated by the machine-trained model, and the at least one prediction of a piece of channel state information based on the machine-trained model, which characterizes a state of at least one radio channel between two communication modules of the wireless communication network, is provided in an output section of the machine-trained model;

ascertaining at least one prediction of the at least one piece of channel state information based on a raytracer as a function of the ascertained state information; and coordinating operation of the model-based ascertainment unit and the raytracer;

ascertaining, using the machine-trained model, a confidence level for the at least one prediction based on the machine-trained model; and activating the raytracer for ascertaining the prediction based on the raytracer as a function of the ascertained confidence level or providing the prediction based on the machine-trained model.

7. The method as recited in claim 6, further comprising:

ascertaining a plurality of pieces of state information as a function of a plurality of positions of a plurality of candidate trajectories of at least one component of the surroundings;

ascertaining a respective prediction based on the machine-trained model for each of the plurality of pieces of state information; and
selecting one of the candidate trajectories as a function of the plurality of the predictions assigned to one of the respective candidate trajectories.

8. The method as recited in claim 6, further comprising:
comparing the state information which characterizes the state of the surroundings of the wireless communication network, with a further piece of state information which characterizes a further state of the surroundings of the wireless communication network; and
activating either the model-based ascertainment unit or the raytracer for ascertaining the prediction based on the machine-trained model or the prediction based on the raytracer as a function of the comparison.

9. The method as recited in claim 8, wherein the further piece of state information represents at least a portion of training input data, with which the machine-trained model has been trained.

10. A method comprising the following steps:
ascertaining or providing a piece of state information, which characterizes a simulated state of a spatial arrangement of components of surroundings of a wireless communication network;
ascertaining at least one prediction based on a machine-trained model, the state information being provided as an input parameter in an input section of the machine-trained model, the state information being propagated by the machine-trained model, and the at least one prediction of a piece of channel state information based on the machine-trained model, which characterizes a state of at least one radio channel between two communication modules of the wireless communication network, is provided in an output section of the machine-trained model;
ascertaining at least one prediction of the at least one piece of channel state information based on a raytracer as a function of the ascertained state information; and
coordinating operation of the model-based ascertainment unit and the raytrace;
ascertaining or providing a plurality of radio lobe coordinates which are associated with at least one of the communication modules of the wireless communication network, in addition to the state information;
providing the state information and the radio lobe coordinates as input parameters to the input section of the machine-trained model, the state information and at least one of a plurality of radio lobe coordinates being propagated by the machine-trained model, and at least one relevance of a respective radio lobe associated with the radio lobe coordinates being provided in the output section of the machine-trained model;
selecting those radio lobe coordinates of the plurality of radio lobe coordinates that are associated with an increased relevance; and
ascertaining at least one prediction of the at least one piece of channel state information based on the raytracer on the basis of the selected radio lobe coordinates.

11. A device for training a model, comprising:
an input unit configured in such a way that a piece of state information, which characterizes a state of a spatial arrangement of components of surroundings, is ascertained or provided;
a raytracer configured in such a way that at least one prediction of the at least one piece of channel state information based on the raytracer, which characterizes a state of at least one radio channel between two communication modules of the surroundings, is ascertained as a function of the state information; and
a training set generator configured in such a way that at least one training set including the state information and the prediction based on the raytracer is ascertained; and
a training unit configured in such a way that the model is trained using the at least one training set;
wherein the input unit is configured in such a way that, in addition to the state information, a plurality of radio lobe coordinates, which are associated with at least one of the communication modules of the surroundings, are ascertained or provided, wherein the raytracer is configured in such a way that the at least one prediction based on the raytracer and a relevance of radio lobes associated with the radio lobe coordinates, is ascertained as a function of the ascertained state and of at least one of the plurality of radio lobe coordinates, and wherein the training set generator is configured in such a way that at least one training set, including the state information, the prediction based on the raytracer, and the ascertained relevances, is ascertained.

12. A method for training a model, comprising:
ascertaining or providing a piece of state information, which characterizes a state of a spatial arrangement of components of surroundings;
ascertaining at least one prediction of the at least one piece of channel state information based on a raytracer, which characterizes a state of at least one radio channel between two communication modules of the surroundings, as a function of the state information;
ascertaining at least one training set, including the state information and the prediction based on the raytracer;
training the model using the at least one training set;
ascertaining or providing a plurality of radio lobe coordinates, which are associated with at least one of the communication modules of the surroundings, in addition to the state information;
ascertaining the at least one prediction based on the raytracer and a relevance of each of the radio lobes associated with the radio lobe coordinates as a function of the ascertained state and of at least one of the plurality of radio lobe coordinates; and
ascertaining the at least one training set, including the state information, the associated prediction based on the raytracer, and the ascertained relevances.

* * * * *